United States Patent
Zhang et al.

(10) Patent No.: US 11,899,293 B2
(45) Date of Patent: Feb. 13, 2024

(54) ELECTRO OPTICAL DEVICES FABRICATED USING DEEP ULTRAVIOLET RADIATION

(71) Applicant: HyperLight Corporation, Cambridge, MA (US)

(72) Inventors: Mian Zhang, Cambridge, MA (US); Kevin Luke, Cambridge, MA (US)

(73) Assignee: HyperLight Corporation, Cambridge, MA (US)

( * ) Notice: Subject to any disclaimer, the term of this patent is extended or adjusted under 35 U.S.C. 154(b) by 548 days.

(21) Appl. No.: 16/871,658

(22) Filed: May 11, 2020

(65) Prior Publication Data

US 2021/0247570 A1    Aug. 12, 2021

Related U.S. Application Data

(63) Continuation-in-part of application No. 16/785,206, filed on Feb. 7, 2020, now Pat. No. 11,086,048.

(51) Int. Cl.
*G02F 1/03*    (2006.01)
*G02F 1/07*    (2006.01)
(Continued)

(52) U.S. Cl.
CPC ............... *G02F 1/03* (2013.01); *G02B 6/13* (2013.01); *G02F 1/05* (2013.01); *G03F 7/70008* (2013.01);
(Continued)

(58) Field of Classification Search
CPC .. G02B 6/13; G02B 6/136; G02B 2006/1204; G02B 2006/12045; G02B 2006/12097;
(Continued)

(56) References Cited

U.S. PATENT DOCUMENTS

| 10,754,179 B2 | 8/2020 | Ohmori |
| 2004/0012089 A1 | 1/2004 | Rantala |

(Continued)

FOREIGN PATENT DOCUMENTS

| JP | H11-64664 A | † | 3/1999 |
| JP | 2020-20953 A | † | 2/2020 |

(Continued)

OTHER PUBLICATIONS

Weis et al., Lithium Niobate: Summary of Physical Properties and Crystal Structure, 1985, Applied Physics A 37, 191-203 (Year: 1985).*

(Continued)

*Primary Examiner* — Mahidere S Sahle
(74) *Attorney, Agent, or Firm* — Van Pelt, Yi & James LLP

(57) ABSTRACT

An optical device is described. At least a portion of the optical device includes ferroelectric non-linear optical material(s) and is fabricated utilizing ultraviolet lithography. In some aspects the at least the portion of the optical device is fabricated using deep ultraviolet lithography. In some aspects, the short range root mean square surface roughness of a sidewall of the at least the portion of the optical device is less than ten nanometers. In some aspects, the at least the portion of the optical device has a loss of not more than 2 dB/cm.

19 Claims, 9 Drawing Sheets

(51) Int. Cl.
  *G02B 6/13*    (2006.01)
  *G03F 7/00*    (2006.01)
  *G02F 1/05*    (2006.01)
  *G02B 6/12*    (2006.01)

(52) U.S. Cl.
  CPC .............. *G02B 2006/1204* (2013.01); *G02B 2006/12045* (2013.01)

(58) Field of Classification Search
  CPC .......... G02F 1/03; G02F 1/05; G03F 7/70008; G03F 7/38; G03F 7/0005; G03F 7/168
  USPC ................................................. 359/245–279
  See application file for complete search history.

(56) References Cited

U.S. PATENT DOCUMENTS

| | | |
|---|---|---|
| 2008/0253728 A1 | 10/2008 | Sparacin |
| 2018/0269102 A1 | 9/2018 | Chen |
| 2019/0079047 A1 | 3/2019 | Rothberg |
| 2019/0227350 A1 | 7/2019 | Puckett |
| 2019/0346625 A1 | 11/2019 | Cheng |
| 2019/0391415 A1 | 12/2019 | Lipson |

FOREIGN PATENT DOCUMENTS

| | | |
|---|---|---|
| WO | 2017050808 | 3/2017 |
| WO | 2018031916 | 2/2018 |

OTHER PUBLICATIONS

Annoymous "UV 210 Positive DUV Photoresist" Rohm and Haas Electronic Materials Microelectronic Technologies, Apr. 2004.

Wang et al., "Integrated high quality factor lithium niobate microdisk resonators" Optical Sciences of America, vol. 22 No. 25, Dec. 4, 2014.

Siew et al., Ultra-Low Loss Ridge Waveguides on Lithium Niobate via Argon Ion Milling and Gas Clustered Ion Beam Smoothening, vol. 26, No. 4, Feb. 19, 2018, Optics Express 4421.

Krasnokutska et al., Ultra-low Loss Photonic Circuits in Lithium Niobate on Insulator, Optics Express, vol. 26, No. 2, pp. 897-904 (2018).

Marc Reig Escale, "PhD Thesis: Generation, Modulation and Detection of Light in Lithium Niobate Nanophotonic Devices" 146 pages, ETH Zurich, published 2019.

Noguchi Kazuto, "PhD Thesis: A Study of Broadband Optical Modulators in Lithium Niobate", p. 63-69, Waseda University, published on Mar. 2001.†

Krasnokutska, I. et al., "Ulta-low loss photonic circuits in Lithium Niobate On Insulator", arXiv:1708.06787v1 [phsyics.app-ph], published on Aug. 21, 2017.†

* cited by examiner
† cited by third party

1000

| DUV Mask Layer | 1050 |
| ARC Layer | 1040 |
| Hard Mask Layer | 1030 |
| Lithium Niobate Layer | 1010 |
| Underlayer(s) | 1002 |
| Substrate | 1001 |

| DUV Mask 1050A | | DUV Mask 1050A |
| ARC Layer | 1040 | |
| Hard Mask Layer | 1030 | |
| Lithium Niobate Layer | 1010 | |
| Underlayer(s) | 1002 | |
| Substrate | 1001 | |

FIG. 11

ELECTRO OPTICAL DEVICES FABRICATED USING DEEP ULTRAVIOLET RADIATION

CROSS REFERENCE TO OTHER APPLICATIONS

This application is a continuation in part of co-pending U.S. patent application Ser. No. 16/785,206 entitled LITHIUM NIOBATE DEVICES FABRICATED USING DEEP ULTRAVIOLET RADIATION filed Feb. 7, 2020 which is incorporated herein by reference for all purposes.

BACKGROUND OF THE INVENTION

Optical devices, such as waveguides, are utilized in a variety of applications. Lithium niobate devices may be desired to be used in waveguides, resonators, and other optical and electro-optic devices. However, lithium niobate is notoriously difficult to fabricate into devices having the desired performance characteristics. Accordingly, what is desired is a mechanism for providing optical devices that utilize lithium niobate and that have sufficient performance characteristics.

BRIEF DESCRIPTION OF THE DRAWINGS

Various embodiments of the invention are disclosed in the following detailed description and the accompanying drawings.

FIGS. 10-15 depict another embodiment of an optical device including lithium niobate formed using ultraviolet photolithography during fabrication.

DETAILED DESCRIPTION

Figure 1A:
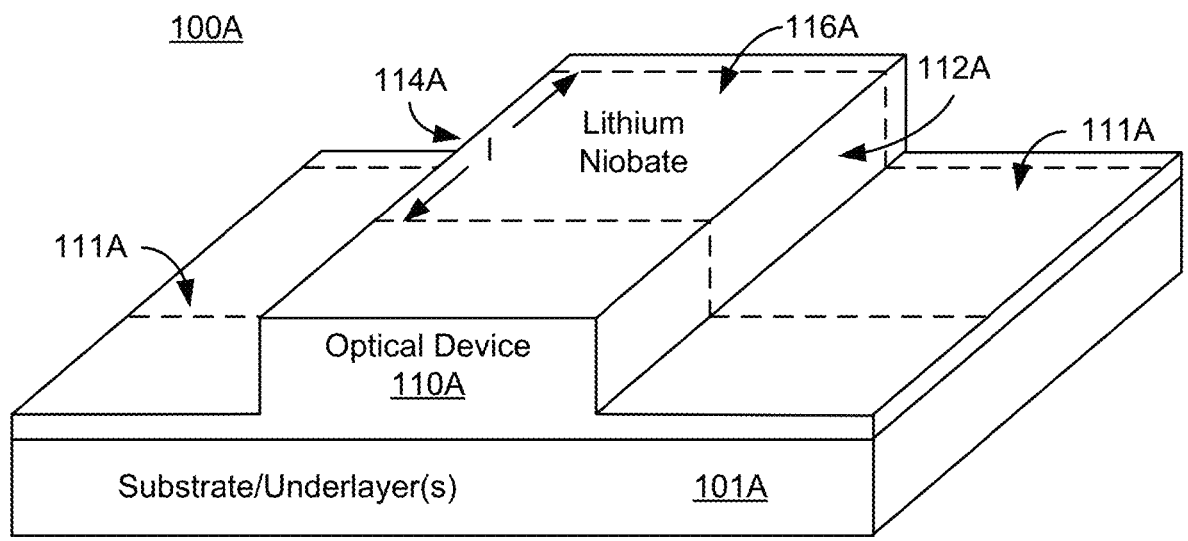
FIGS. 1A-1B depict embodiments of optical devices including lithium niobate fabricating using ultraviolet photolithography.

The invention can be implemented in numerous ways, including as a process; an apparatus; a system; a composition of matter; a computer program product embodied on a computer readable storage medium; and/or a processor, such as a processor configured to execute instructions stored on and/or provided by a memory coupled to the processor. In this specification, these implementations, or any other form that the invention may take, may be referred to as techniques. In general, the order of the steps of disclosed processes may be altered within the scope of the invention. A detailed description of one or more embodiments of the invention is provided below along with accompanying figures that illustrate the principles of the invention. The invention is described in connection with such embodiments, but the invention is not limited to any embodiment. The scope of the invention is limited only by the claims and the invention encompasses numerous alternatives, modifications and equivalents. Numerous specific details are set forth in the following description in order to provide a thorough understanding of the invention. These details are provided for the purpose of example and the invention may be practiced according to the claims without some or all of these specific details. For the purpose of clarity, technical material that is known in the technical fields related to the invention has not been described in detail so that the invention is not unnecessarily obscured.

Lithium niobate (LN) is desired to be used in optical devices, particularly electro-optical devices. As used herein, an optical device may include optical devices and electro-optical devices. The desirability of LN is due at least in part to variation in the refractive index of LN with an applied external electric field. However, fabrication of LN optical devices having desired performance characteristics is challenging. For example, LN optical devices may have higher losses than desired. Recently, LN optical devices have been fabricated using an electron beam to pattern mask layers (e.g. via electron beam lithography). Underlying hard mask and LN layers may be etched using other techniques. The LN optical devices so formed may have improved performance. However, electron beam lithography is time consuming, can be nonuniform and may have limited reproducibility. Electron beams pattern masks utilizing a scanning procedure, which is inherently slow. Moreover, electrons beams are subject to drift during usage. Because beam deflection is limited in range, electron beam photolithography may only pattern relatively small regions, for example on the order of one square millimeter or less. In order to pattern larger regions, the stage for the electron beam is shifted and electron beam lithography repeated. In addition to slowing throughput, this aspect of electron beam lithography may induce misalignments at the stitch between these regions. These misalignments adversely affect performance of the device being fabricated. Thus, an improved method for fabricating LN optical devices is desired.

Other nonlinear optical materials may suffer from analogous drawbacks as LN. For example, lithium tantalate (e.g. $LiTaO_3$) has similar optical properties to LN. Lithium tantalate (LT) may also be challenging to fabricate. Further, LT may be susceptible to damage during high temperature fabrication methods. Other ferroelectric nonlinear (e.g. second order) optical materials may also be desired to be used in optical devices. Such ferroelectric nonlinear optical materials may include but are not limited to potassium niobate (e.g. $KNbO_3$), gallium arsenide (GaAs), potassium titanyl phosphate (KTP), lead zirconate titanate (PZT), and barium titanate ($BaTiO_3$). The techniques described may also be used for other nonlinear ferroelectric optical materials, particularly those which may otherwise be challenging to fabricate. For example, such nonlinear ferroelectric optical materials may have inert chemical etching reactions using conventional etching chemicals such as fluorine, chlorine or bromine compounds. Consequently, an improved method for fabricating devices utilizing ferroelectric nonlinear optical materials, such as LT, is desired.

A method for fabricating an optical device and the optical device so formed are described. At least a portion of the optical device includes LN and is fabricated utilizing photolithography, such as deep ultraviolet (DUV) lithography. Fabricating the optical device may include providing a hard mask layer on a LN layer. A mask is fabricated on the hard mask layer. This mask is formed using DUV photolithography. More specifically, a mask layer is provided, for example by spin coating on DUV photoresist. The mask layer may be heat treated. Portions of the mask layer may be selectively exposed to electromagnetic radiation in the DUV wavelength range. In some embodiments, the mask layer is heat treated again after the exposure. The mask layer is developed. Thus, portions of the mask layer are removed to form a pattern of apertures that expose the underlying hard mask layer. A hard mask is formed from the hard mask layer by transferring the pattern of the mask to the hard mask layer. For example, portions of the hard mask layer uncovered by apertures in the mask may be selectively etched. The hard mask may have depressions or apertures in regions in which the hard mask layer was etched. The pattern of the hard mask may be transferred to the LN layer, for example using a physical etch. At least the exposing may be performed multiple times for multiple stitched regions across the surface of a substrate. In some cases, each of these stitched regions is at least ten millimeters by ten millimeters. In some embodiments, a stitched region may be at least fifteen millimeters by fifteen millimeters. In some embodiments, each stitched region is at least twenty millimeters by twenty millimeters. Thus, longer and/or more optical devices including LN may be fabricated using DUV lithography within a single stitched region.

The LN in the optical device fabricated using DUV lithography has improved surface roughness for the sidewall (s). For example, the short range root mean square surface roughness of a sidewall of the LN in the optical device formed using DUV photolithography is less than ten nanometers. In some embodiments, this root mean square surface roughness is not more than five nanometers. In some cases, the short range root mean square surface roughness does not exceed two nanometers. The LN in the optical device may also have improved performance. In some aspects, the LN in the optical device has a loss of not more than 2 dB/cm. In some embodiments, the LN has a loss of less than 1.0 dB/cm. In some cases, this loss is not more than 0.5 dB/cm. Thus, performance of optical devices including LN may be improved.

Although described in the context of LN, the devices and methods described herein may be applied to other nonlinear (e.g. second order) optical material(s), particularly ferroelectric nonlinear optical materials that may be difficult to fabricate using conventional techniques. Such nonlinear ferroelectric optical materials may have inert chemical etching reactions for conventional etching using chemicals such as fluorine, chlorine or bromine compounds. For example, LT, potassium niobate, gallium arsenide, potassium titanyl phosphate, lead zirconate titanate, and/or barium titanate may be used in lieu of or in addition to LN. For example, the method fabricating an optical device and the optical device so formed are such that at least a portion of the optical device includes ferroelectric nonlinear optical material(s) (e.g. LT) and is fabricated utilizing photolithography, such as DUV lithography. Fabricating the optical device may include providing a hard mask layer on a ferroelectric nonlinear optical layer. A mask is fabricated on the hard mask layer. This mask is formed using DUV photolithography. More specifically, a mask layer is provided, for example by spin coating on DUV photoresist. The mask layer may be heat treated. Portions of the mask layer may be selectively exposed to electromagnetic radiation in the DUV wavelength range. In some embodiments, the mask layer is heat treated again after the exposure. The mask layer is developed. Thus, portions of the mask layer are removed to form a pattern of apertures that expose the underlying hard mask layer. A hard mask is formed from the hard mask layer by transferring the pattern of the mask to the hard mask layer. For example, portions of the hard mask layer uncovered by apertures in the mask may be selectively etched. The hard mask may have depressions or apertures in regions in which the hard mask layer was etched. The pattern of the hard mask may be transferred to the ferroelectric nonlinear optical layer, for example using a physical etch. At least the exposing may be performed multiple times for multiple stitched regions across the surface of a substrate. In some cases, each of these stitched regions is at least ten millimeters by ten millimeters. In some embodiments, a stitched region may be at least fifteen millimeters by fifteen millimeters. In some embodiments, each stitched region is at least twenty millimeters by twenty millimeters. Thus, longer and/or more optical devices including LN may be fabricated using DUV lithography within a single stitched region.

The ferroelectric nonlinear optical material(s) in the optical device fabricated using DUV lithography have improved surface roughness for the sidewall(s). For example, the short range root mean square surface roughness of a sidewall of the ferroelectric nonlinear optical material(s) (e.g. LT) in the optical device formed using DUV photolithography is less than ten nanometers. In some embodiments, this root mean square surface roughness is not more than five nanometers. In some cases, the short range root mean square surface roughness does not exceed two nanometers. The ferroelectric nonlinear optical material(s) such as LT in the optical device may also have improved performance. In some aspects, the ferroelectric nonlinear optical material(s) in the optical device have a loss of not more than 2 dB/cm. In some embodiments, the ferroelectric nonlinear optical material(s) has a loss of less than 1.0 dB/cm. In some cases, this loss is not more than 0.5 dB/cm. Thus, performance of optical devices including ferroelectric nonlinear optical material(s) may be improved.

Figure 1B:
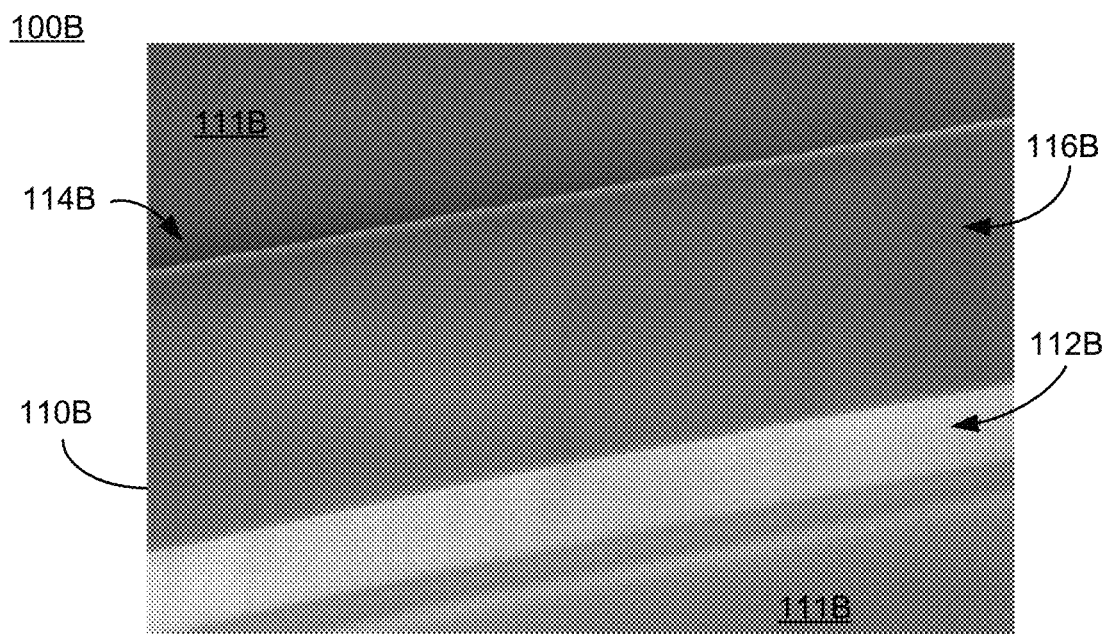

FIGS. 1A and 1B depict embodiments of devices 100A and 100B, respectively, including LN fabrication using photolithography, such as DUV lithography. FIG. 1A is a diagram depicting device 100A including optical device 110A formed on substrate 101A. FIG. 1A is not to scale. Substrate 101A may include a carrier wafer as well as any underlayers between the wafer and optical device 110A. Optical device 110A includes an LN region. Although shown as only part of optical device 110A, the entire layer may be formed of LN. In some embodiments, optical device 110A may include other components that are not shown. Optical device 110A includes flat regions 111A, sidewalls 112A and 114A as well as top surface 116A. Thus, optical device 110 includes a ridge having sidewalls 112A and 114A and top surface 116A. Thus, in the embodiment shown, the LN layer is not completely etched through. In another embodiment and/or in other regions, the LN layer may be etched through to expose the underlying layers such as substrate 101A. In such an embodiment, some or all of flat regions 111A may be omitted.

Similarly, FIG. 1B is micrograph of device 100B including optical device 110B formed on a substrate (not shown). The substrate may include a carrier wafer as well as any underlayers between the wafer and optical device 110B. Optical device 110B consists of an LN layer. In some embodiments, optical device 110B may include other components that are not shown. Optical device 110B includes a ridge having sidewalls 112B and 114A as well as top surface 116B and flat regions 111B.

LN region of optical device 110A and optical device 110B are formed using DUV lithography. As a result, sidewalls 112A, 114A, 112B and 114B of optical devices 110A and 110B have improved surface roughness. The short range root mean square (RMS) surface roughness is the RMS surface roughness for lengths (e.g. along direction 1) of not more than two hundred nanometers. The short range RMS surface roughness of sidewalls 112A and 114A of LN region in optical device 110A and the short range RMS surface roughness of LN optical device 110B are each less than ten nanometers. In some embodiments, the short range RMS surface roughness for both the LN region of optical device 110A and LN optical device 110B is not more than five nanometers. The short range RMS surface roughnesses of the LN region of optical device 110A and LN optical device 110B do not exceed two nanometers in some embodiments. Further, the short range RMS roughness of each of top surfaces 116A and 116B is not more than one nanometer in some embodiments. In some embodiments, the long range (lengths greater than two hundred nanometers through two hundred micrometers) RMS surface roughness of sidewalls 112A, 114A, 112B and/or 114B may differ from the short range RMS surface roughness.

Figure 2:
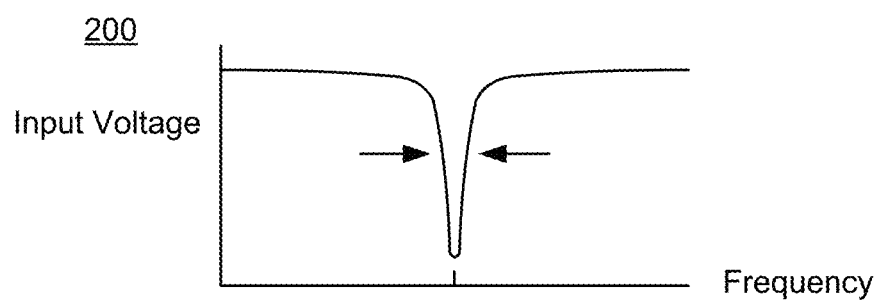
FIG. 2 depicts an embodiment of a measurement indicating transmission in an optical device including lithium niobate and fabricated using ultraviolet photolithography.

Because of the improved smoothness, the optical device may have improved performance. This may be seen in reference to FIG. 2, which depicts an embodiment 200 of a measurement indicating transmission in an optical device including lithium niobate and fabricated using ultraviolet photolithography. Graph 200 indicates transmission through an LN optical device, such as optical device(s) 110A and/or 110B, that operates as a resonator. The dip in graph 200 indicates resonance. In some embodiments, the width of the peak is on the order of picometers and indicates the efficiency of the corresponding optical device. In some embodiments, LN region of optical device 110A and LN optical device 110B has a loss in signal of not more than 5 dB/cm. In some embodiments, LN region of optical device 110A and LN optical device 110B each has a loss of not more than 2 dB/cm. In some such embodiments, the loss for each of LN region of optical device 110A and LN optical device 110B is less than 1.0 dB/cm. For example, this loss may be not more than 0.5 dB/cm in some embodiments.

Thus, optical devices 110A and 110B fabricated using DUV lithography may have reduced surface roughness and improved efficiency. Further, because patterning is performed using DUV lithography, optical devices 110A and 110B may be fabricated with higher reproducibility, better uniformity, higher throughput, and over a larger region of substrate 101A and 101B. Thus, the method for fabricating optical devices including LN and the optical devices so formed may be improved.

Figure 3:
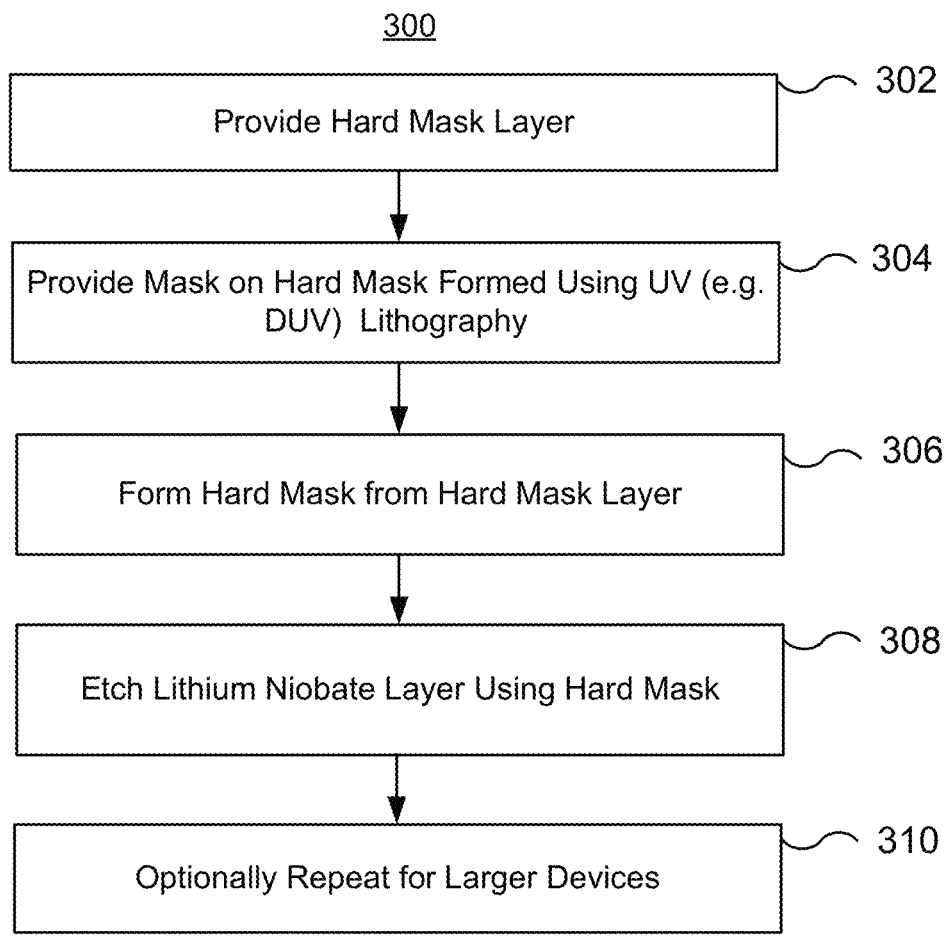
FIG. 3 is a flow chart depicting an embodiment of a method for forming an optical device including lithium niobate using ultraviolet photolithography.

FIG. 3 is a flow chart depicting an embodiment of method 300 for forming an optical device including LN using ultraviolet lithography, such as DUV lithography. Method 300 is described in the context of processes that may have sub-processes. Although described in a particular order, another order not inconsistent with the description herein may be utilized. Method 300 starts after a LN layer has been provided on a substrate. In some embodiments, the LN layer may be thin, for example, not more than ten micrometers in thickness. In some embodiments, the LN layer may be not more than one micrometer in thickness. In some embodiments, the thickness of the LN layer may be not more than seven hundred nanometers. In some such embodiments, the thickness may be not more than four hundred nanometers. Other thicknesses are possible. Underlayers, such as silicon dioxide, may exist between the LN layer and a carrier wafer. In some embodiments, the carrier wafer may include silicon, quartz, silica, LN, sapphire and/or another material. For example, the LN layer may reside on a silicon dioxide underlayer having a thickness of nominally at least two and not more than five micrometers. Other thicknesses, additional layers and/or other layers may be present.

A hard mask layer is provided, at 302. In some embodiments, the hard mask may include one or more of amorphous silicon, silicon dioxide, silicon nitride, ceramic, metal (e.g. Ti) or other hard mask material. In some embodiments, chemical vapor deposition (CVD) or other deposition method may be utilized at 302.

A mask is formed on the hard mask layer using UV lithography, at 304. In some embodiments, 304 includes providing a mask layer. For example, the mask layer may be a photoresist layer spin coated onto the hard mask layer. Using UV lithography, portions of the mask layer are selectively exposed. In some embodiments, the wavelengths of electromagnetic radiation used for UV photolithography are not more than four hundred fifty nanometers. In some embodiments, DUV lithography is utilized. For example, the wavelength of electromagnetic radiation used may be less than two hundred and fifty nanometers. In some embodiments, other wavelengths of electromagnetic radiation may be used to expose the mask layer. Also as part of 304, the mask layer may be heat treated (e.g. baked) before and/or after exposure. The exposed mask is also developed. In some embodiments, no post-development bake is performed. Thus, portions of the mask layer are removed to form aperture(s) in the mask layer. Consequently, a mask having a pattern is formed.

The hard mask is provided from the hard mask layer, at 306. To do so, the mask formed by DUV lithography is utilized. Thus, a pattern from the mask may be transferred to the hard mask layer. The hard mask is thus formed. In some embodiments, 306 includes chemically and/or physically removing portions of the hard mask layer uncovered by the pattern in the mask. In some embodiments, the removal at 306 forms apertures in the hard mask layer to provide the hard mask. In some embodiments, the removal at 306 forms depressions in the hard mask layer to provide the hard mask. A hard mask may be used in method 300 because the mask patterned using DUV lithography may be more subject to removal by the etch used in patterning the LN layer at 308, described below. Such removal of the mask may result in sidewalls of the optical device that have a higher surface roughness than desired. However, in other embodiments, steps 302 and 304 might be omitted, for example if a higher surface roughness might be tolerated.

The LN layer is etched using the hard mask, at 308. Thus, the pattern in the hard mask may be transferred to the LN layer at 308. In some embodiments, a physical etch is used at 308. For example, a dry etch, a reactive ion etch (RIE), a plasma etch and/or other physical etching mechanism may be utilized at 308. In some embodiments, a chemical etch or other etch may be used at 308. In embodiments in which the hard mask includes depressions instead of apertures, the pattern transfer at 308 also removes at least some of the thinned portions of the hard mask. In some embodiments, the LN layer is not completely etched through at 308. Thus, the optical devices formed may be raised portions, or ridges, remaining after 308. In some embodiments, portions of the LN layer may be etched through at 308. Also at 308, any remaining mask and/or hard mask may be removed.

Some or all of method 300 is optionally repeated, at 310. For example, at 304 a mask layer may be provided and baked. After one region is exposed, a stage may be shifted to expose additional region(s) of the mask layer. Thus, this portion of 304 may be repeated. Once all desired regions have been exposed, the mask layer may undergo development to provide the mask for the entire substrate. The pattern may then be transferred to underlying layers at 306 and 308. Thus, at least part of 304 is repeated one or more times in some embodiments. In other embodiments, 302, 304, 306 and 308 may be repeated for different regions of the substrate. Thus, multiple regions of a device may be fabricated. For example, larger optical devices and/or optical devices that extend across edges of the regions patterned may be formed.

For example, FIGS. 4-8 depict an embodiment of device 400 including LN and formed using method 300 during fabrication. FIGS. 4-8 are not to scale and only a portion of the device 400 is shown. Further, device 400 is for explanatory purposes and may not represent a particular device. For example, sidewalls are generally shown as vertical and flat, while top surface are generally shown as horizontal and flat. However, some variations are generally present.

Figure 4:
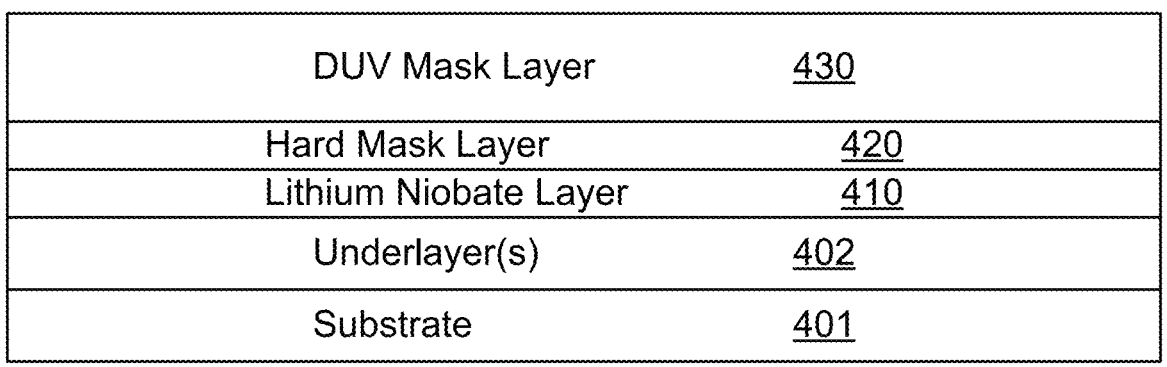
FIGS. 4-8 depict an embodiment of an optical device including lithium niobate formed using ultraviolet photolithography during fabrication.

FIG. 4 depicts device 400 after the mask layer has been provided as part of 304. Thus, substrate 401 which may include a carrier wafer, underlayer 402, LN layer 410, hard mask layer 420 and DUV mask layer 430 are shown. Underlayer 402 may be an insulator such as silicon dioxide. In this embodiment, underlayer 402 is depicted separately from substrate 401. In some embodiments, other layers may be present and/or some layer(s) shown may be omitted. For example, underlayer 402 may be omitted in some embodiments.

Figure 5:
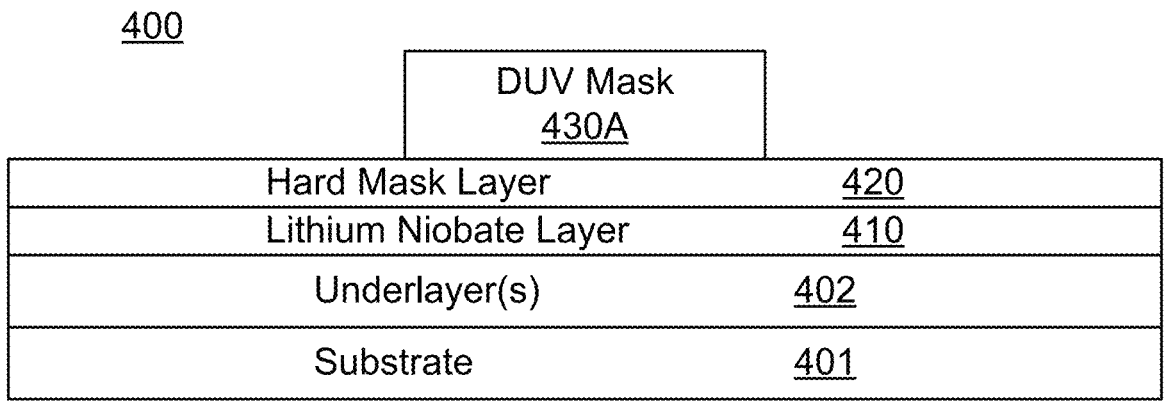

FIG. 5 depicts device 400 after 304 has been completed. DUV mask layer 430 has been selectively exposed to DUV light and developed. Thus, DUV mask 430A has been formed. Portions of hard mask layer 420 are uncovered by DUV mask 430A.

Figure 6:
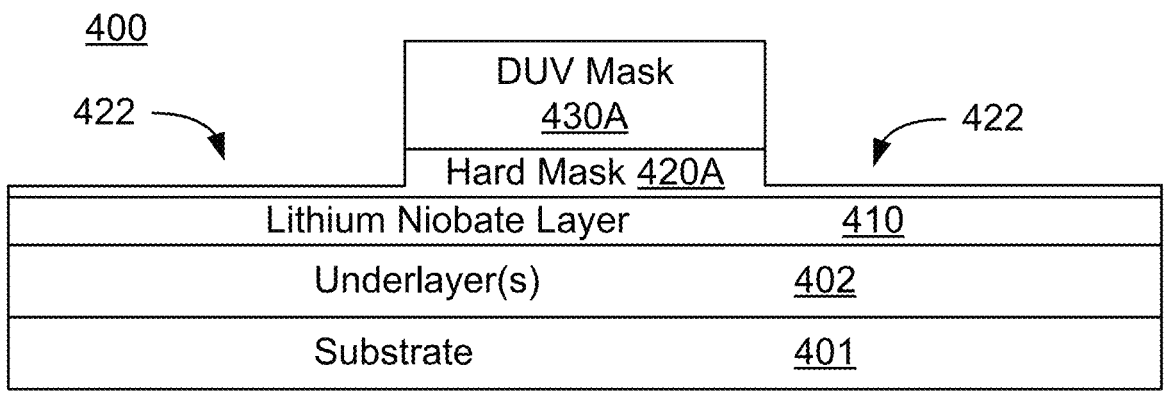

FIG. 6 depicts device 400 after 306 has been completed. Thus, hard mask 420A has been formed. In the embodiment shown, the pattern of DUV mask 430A has been transferred to hard mask 420A. In the embodiment shown, hard mask 420A has depressions 422 in the regions where hard mask layer 430 was etched. Thus, the pattern of DUV mask 430A has been transferred to hard mask 420A.

Figure 7:
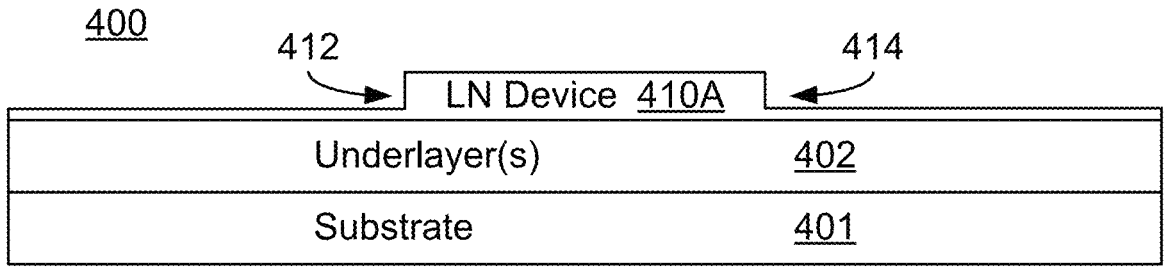
Figure 8:
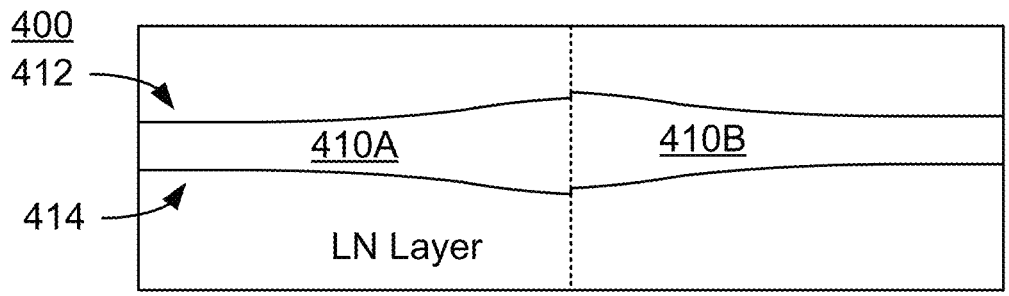

FIGS. 7-8 depicts device 400 after 308 has been completed. DUV mask 430A and hard mask 420A have also been removed. FIG. 7 is a cross sectional view of device 400. FIG. 8 is a plan view of device 400 indicating a stitch (shown by dashed line). Thus, LN optical device 410A is shown in FIGS. 7 and 8. Also shown in FIG. 8 is LN optical device 410B. In some embodiments, LN optical device 410A and/or LN optical device 410B include other components. For simplicity, however, only a portion of LN optical device 410A and a portion of LN optical device 410B are shown. LN optical devices 410A and 410B may be considered ridges formed in LN layer 410 by removing portions of LN layer uncovered by hard mask 420A. Thus, sidewalls of optical devices 410A and 410B, such as sidewalls 412 and 414, are sidewalls for the ridges. In some embodiments, LN layer 410 may be etched through at 308. In such embodiments, the underlying layers, such as underlayer(s) 402, may be exposed after 308 is completed.

LN optical devices 410A and 410B are in different stitched regions that are exposed at different times. Thus, as indicated in FIG. 8, LN optical devices 410A and 410B may be misaligned. Consequently, LN optical devices 410A and 410B are slightly widened in the region of the stitch in order to reduce the impact of such misalignments. Thus, in the embodiment shown, LN optical devices 410A and 410B may be considered part of a single optical device that spans multiple stitched regions. LN optical devices 410A and 410B are also formed using DUV lithography. Thus, each has sidewalls. Sidewalls 412 and 414 of LN optical device 410A are labeled in FIGS. 7 and 8. Sidewalls 412 and 414 have improved surface roughness because of the use of DUV lithography. The short range RMS surface roughnesses of sidewalls 412 and 414 of LN optical device 410A are each less than ten nanometers. In some embodiments, the short range RMS surface roughness for each sidewall 412 and 414 of LN optical device 410A is not more than five nanometers. The short range RMS surface roughness of each sidewall 412 and 414 of LN optical device 410A does not exceed two nanometers in some embodiments. LN optical device 410B has analogous short range RMS surface roughness(es) as LN optical device 410A.

Optical devices 410A and 410B may have improved performance. In some embodiments, each LN optical device 410A and 410B has a loss in signal of not more than 5 dB/cm. In some embodiments, LN optical devices 410A and 410B each has a loss of not more than 2 dB/cm. In some such embodiments, the loss for each of LN optical devices 410A and 410B is less than 1.0 dB/cm. For example, this loss may be not more than 0.5 dB/cm in some embodiments.

Thus, LN optical devices 410A and 410B may have improved manufacturability, performance and reduced sidewall surface roughness. Because DUV lithography is utilized, throughput may be increased and the time taken to fabricate device 400 reduced, uniformity may be improved and reproducibility enhanced. DUV lithography also has large stitched regions. For example, in some embodiments, a stitched region that is at least ten millimeters by ten millimeters may undergo DUV lithography in a single shot. In some embodiments, a stitched region may be at least fifteen millimeters by fifteen millimeters. For example, a stitched region may be nominally twenty millimeters by twenty millimeters or larger. Thus, the number of stitches, such as shown in FIG. 8, is reduced. This may not only increase throughput and reproducibility, but also reduce misalignments (e.g. as shown between LN optical device 410A and 410B) in an optical device.

Figure 9:
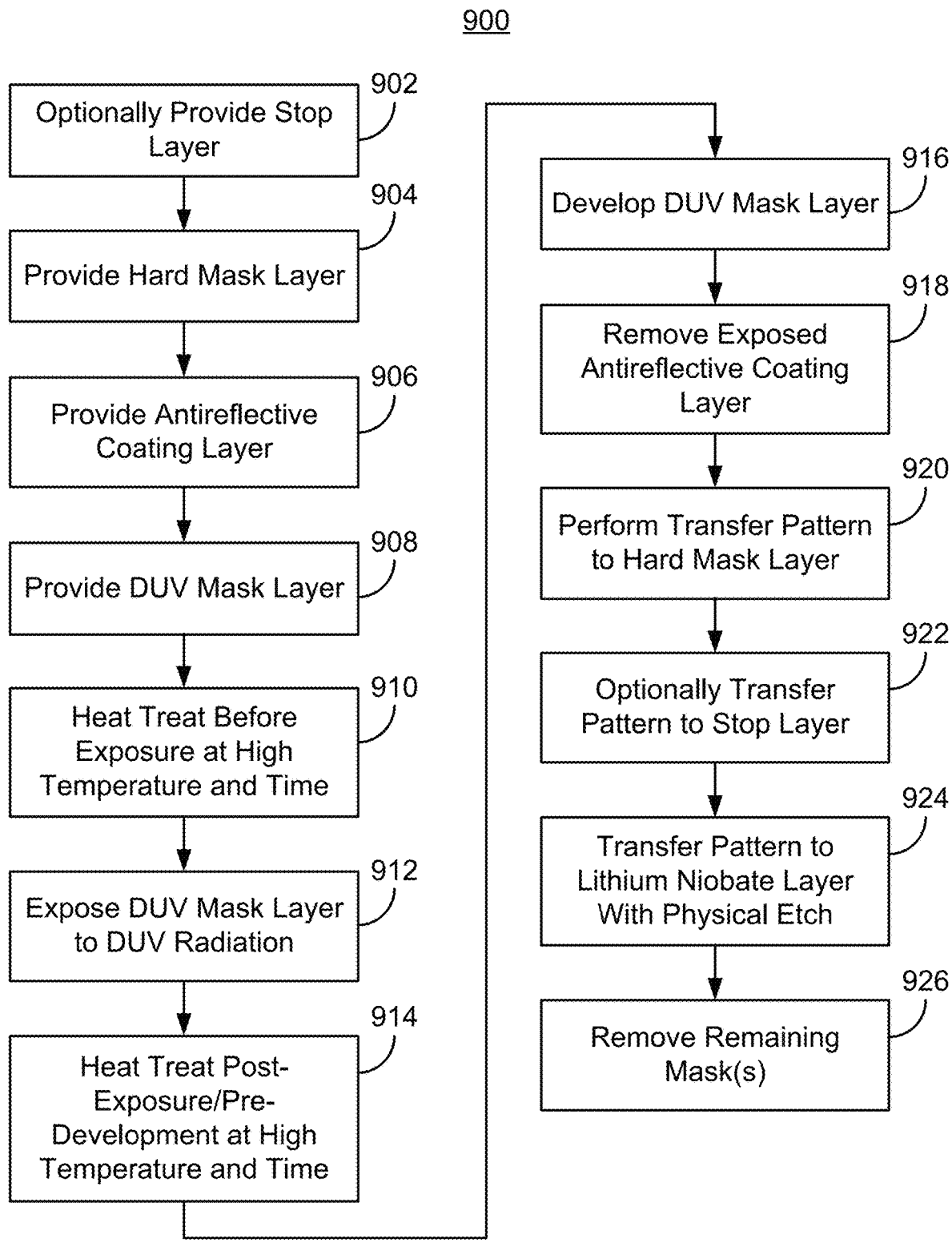
FIG. 9 is a flow chart depicting an embodiment of a method for forming an optical device including lithium niobate using deep ultraviolet photolithography.

FIG. 9 is a flow chart depicting an embodiment of method 900 for forming an optical device including LN using DUV lithography. Method 900 is described in the context of processes that may have sub-processes. Although described in a particular order, another order not inconsistent with the description herein may be utilized. Method 900 starts after a LN layer has been provided on a substrate, such as a carrier wafer. In some embodiments, the LN layer may be thin, for example, not more than ten micrometers in thickness. In some embodiments, the LN layer may be not more than one micrometer thick. In some embodiments, the thickness of the LN layer may be not more than seven hundred nanometers. In some such embodiments, the thickness may be not more than four hundred nanometers. Other thicknesses are possible. Insulating underlayer(s), such as silicon dioxide, may exist between the LN layer and the underlying wafer. For example, the LN layer may reside on a silicon dioxide underlayer having a thickness of nominally at least two and not more than approximately five micrometers. Other thicknesses, additional layers and/or other layers may be present.

A stop layer may be provided, at 902. The stop layer is insensitive to an etch which may be used in forming the hard mask. For example, if a chemical etch is utilized in selectively removing portions of the hard mask layer, as discussed below, then the stop layer provided at 902 is insensitive to the chemistry used in such an etch. If multiple etches are utilized in forming the hard mask, then the stop layer provided at 902 is desired to be insensitive to at least the final etch(es) used in patterning the hard mask. The etch stop layer provided at 902 may also be removed without undue damage to the underlying LN layer. In some embodiments, 902 may be omitted.

A hard mask layer is provided, at 904. In some embodiments, the hard mask may include one or more of amorphous silicon, silicon dioxide, silicon nitride, aluminum oxide, titanium dioxide, a ceramic, another semiconductor and/or other hard mask material. In some embodiments, a metal hard mask may be used. In some embodiments, CVD, plasma enhanced CVD or other deposition method may be utilized at 904.

An antireflective coating (ARC) layer is provided on the hard mask layer, at 906. In some embodiments, the ARC layer is spin coated on the hard mask layer. The ARC layer is configured to reduce reflections of DUV electromagnetic radiation from the underlying layers during DUV lithography for the DUV mask. In some embodiments, 906 may be omitted.

A DUV mask layer is provided on the ARC layer, at 908. In some embodiments, the DUV mask layer is a polymer, such as DUV photoresist. For example, a DUV photoresist such as UV™ 210 Positive DUV Photoresist may be used. In some embodiments, 908 includes spin coating the DUV mask layer. However, other deposition methods are possible.

The DUV mask layer is heat treated prior to exposure, at 910. Thus, 910 may be considered a pre-exposure baking or pre-exposure heat treatment. In some embodiments, the heat treatment at 910 is performed at temperature(s) greater than one hundred and forty degrees Celsius. In some embodiments, the heat treatment is at temperature(s) greater than one hundred and forty-five degrees Celsius. For example, temperatures at or near one hundred and fifty degrees Celsius may be used for the heat treatment at 910. In some embodiments, the heat treatment is for greater than one minute. In some embodiments, at least seventy seconds is used for the heat treatment. In some embodiments, the heat treatment at 910 is for at least eighty seconds. For example, the device may be heat treated at temperature(s) at or around one hundred and fifty degrees Celsius for a time of nominally ninety seconds or more.

In some embodiments, 910 includes gradually increasing the temperature the device is exposed to for the pre-exposure heat treatment. In some embodiments, the temperature (e.g. of the mask layer, other portion of the device, or as measured in an oven or on a hot plate) is increased at a rate of not more than 140 degrees Celsius per minute. In some embodiments, the rate of increase of the temperature is not more than one hundred and twenty-five degrees Celsius per minute. In some embodiments, the temperature is increased at a rate of not more than one hundred degrees Celsius per minute.

The DUV mask layer is selectively exposed to DUV radiation, at 912. For example, wavelengths of not more than two hundred and fifty nanometers may be used at 912. In some embodiments, 912 includes exposing multiple stitched regions. For example, a stitched region may be exposed, the stage moved and another region exposed with the same or a different reticle. Thus, the DUV mask layer is selectively exposed to DUV radiation.

The DUV mask layer is heat treated after the exposure, at 914. Thus, 914 may be considered a post-exposure baking or post-exposure heat treatment. In some embodiments, the heat treatment at 914 is performed at temperature(s) greater than one hundred and forty degrees Celsius. In some embodiments, the heat treatment is at temperature(s) greater than one hundred and forty-five degrees Celsius. For example, temperatures at or near one hundred and fifty degrees Celsius may be used for the heat treatment at 914. In some embodiments, the heat treatment is for greater than one minute. In some embodiments, at least seventy seconds is used for the heat treatment. In some embodiments, the heat treatment at 914 is for at least eighty seconds. For example, the device may be heat treated at temperature(s) at or around one hundred and fifty degrees Celsius for a time of nominally ninety seconds or more.

In some embodiments, 914 includes gradually increasing the temperature to which the device is exposed for the post-exposure heat treatment. In some embodiments, the temperature (e.g. of the mask layer, other portion of the device, or as measured in an oven or on a hot plate) is increased at a rate of not more than 140 degrees Celsius per minute. In some embodiments, the rate of increase of the temperature is not more than one hundred and twenty-five degrees Celsius per minute. In some embodiments, the temperature is increased at a rate of not more than one hundred degrees Celsius per minute.

The exposed DUV mask layer is also developed, at 916. In some embodiments, no post-development bake is performed. Thus, portions of the DUV mask layer are removed to form aperture(s) in the DUV mask layer. Consequently, a DUV mask having a pattern is formed.

The portions of the ARC layer that are uncovered by apertures in the DUV mask are removed, at 918. For example, the ARC layer may be etched at 918. In some embodiments, 918 may be omitted. In such embodiments, the ARC layer may be removed in the same process utilized at 920.

The pattern of the DUV mask is transferred to the hard mask layer, at 920. In some embodiments, the pattern in the DUV mask is also transferred to the ARC layer. The hard mask is thus formed. In some embodiments, 920 includes chemically and/or physically removing portions of the hard mask layer uncovered by the pattern in the mask. For example, if the hard mask layer is a silicon dioxide layer then a fluorine-based chemistry may be used at 920. In other embodiments, a dry etch, an RIE or other etching mechanism may be used. In some embodiments, the removal at 920 forms apertures in the hard mask layer to provide the hard mask. In such embodiments, the stop layer formed at 902 may prevent damage to the underlying LN layer. In some embodiments, the removal at 920 forms depressions in the hard mask layer to provide the hard mask. Thus, damage to the LN layer may still be avoided.

The pattern of the hard mask may be transferred to the stop layer, at 922. This may occur via a chemical or physical etch. The etch used to remove the stop layer at 922 is different from one or more of the etch(es) used to pattern the hard mask at 920. In some embodiments, 922 may be omitted.

The pattern in the hard mask is transferred to the LN layer, at 924. In some embodiments, a physical etch is used at 924. For example, a dry etch, a reactive ion etch (RIE), a plasma etch and/or other physical etching mechanism may be utilized. In some embodiments, a chemical etch or other removal mechanism may be used at 924. In some embodiments, the LN layer is not etched through at 924. Thus, LN optical devices may be formed of or include ridges remaining after partial removal of portions of the LN layer. In some embodiments, the LN layer may be completely etched through in some regions. In embodiments in which the hard mask includes depressions instead of apertures, the pattern transfer at 924 also removes at least some of the thinned portions of the hard mask. In some embodiments, the pattern transfer at 924 may also remove some or all of the etch stop layer uncovered by the hard mask. The etch used to form the hard mask at 920 may be decoupled from the etch used to remove portions of the LN layer at 924. Consequently, these etches may be separately optimized. This may result in smoother sidewalls for the optical device(s) being fabricated.

Any remaining DUV mask, ARC layer, and/or hard mask may be removed, at 926. Fabrication of the device may be completed. For example, the LN optical device(s) formed may be singulated and/or additional components fabricated.

For example, FIGS. 10-15 depict an embodiment of device 1000 including LN and formed using method 900 during fabrication. FIGS. 10-15 are not to scale and only a portion of the device 1000 is shown. Further, device 1000 is for explanatory purposes and may not represent a particular device. For example, sidewalls are shown as vertical and flat, while top surface are shown as horizontal and flat. However, some variations are generally present.

FIG. 10 depicts device 1000 after 904, 906 and 908 have been completed. Thus, substrate 1001 which may include a carrier wafer, underlayer 1002, LN layer 1010, hard mask layer 1030, ARC layer 1040 and DUV mask layer 1050 are shown. Underlayer 1002 may be an insulator such as silicon dioxide. In this embodiment, underlayer 1002 is depicted separately from substrate 1001. In some embodiments, other layers may be present and/or some layer(s) shown may be omitted. For example, underlayer(s) 1002 may be omitted in some embodiments. In the embodiment shown, an etch stop layer is not utilized. Thus, 902 and 922 are omitted.

FIG. 11 depicts device 1000 after 910, 912, 914 and 916 have been completed. DUV mask layer 1050 has undergone a pre-exposure bake, been selectively exposed to DUV radiation, undergone a post-exposure bake and developed. Thus, DUV mask 1050A has been formed. Portions of ARC layer 1040 are uncovered by DUV mask 1050A.

Figure 12:
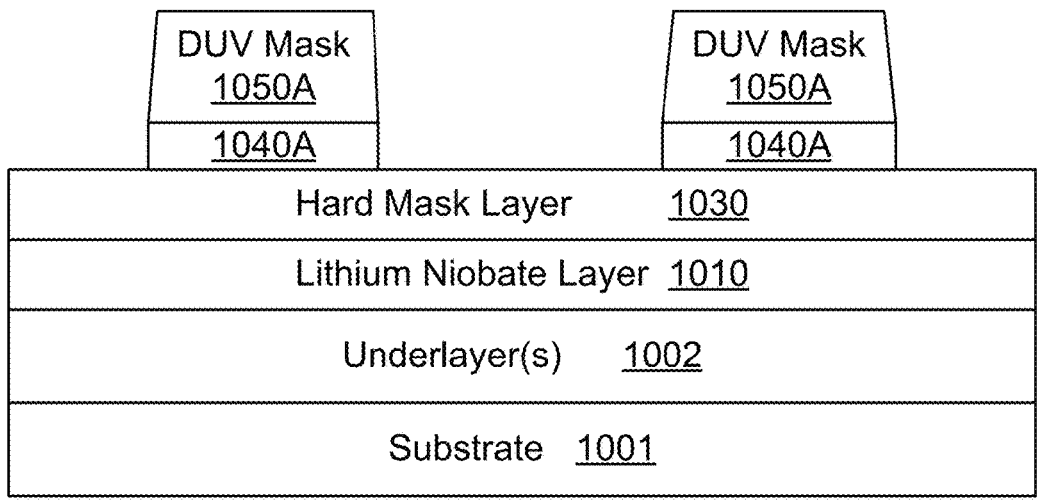

FIG. 12 depicts device 1000 after 918 has been completed or the portions of ARC layer 1040 left uncovered by DUV mask 1050A have been otherwise removed (e.g. as part of 920). Thus, portions of hard mask layer 1030 are uncovered.

Figure 13:
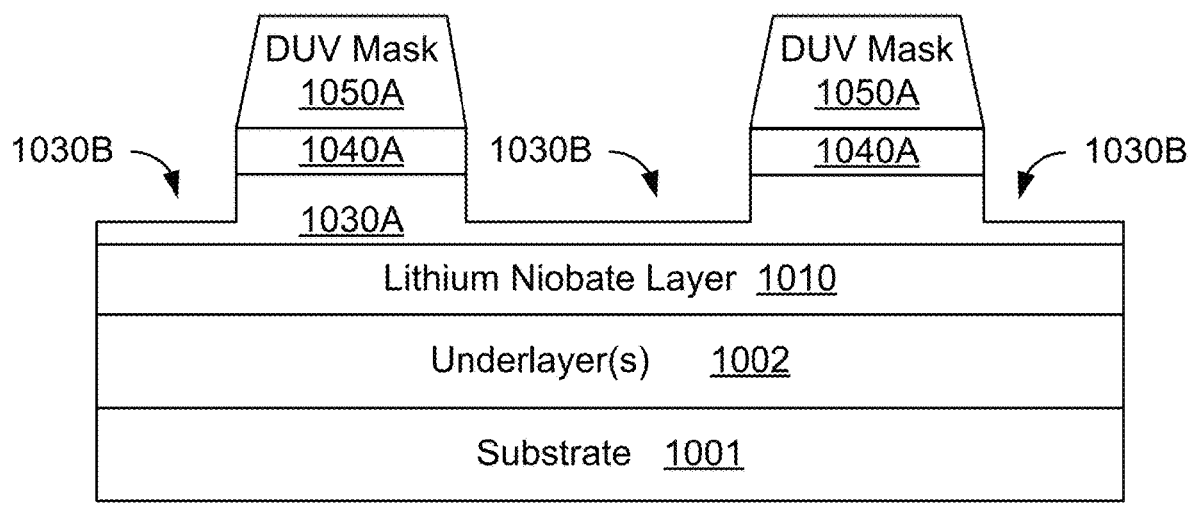

FIG. 13 depicts device 1000 after 920 has been completed. Thus, the pattern of DUV mask 1050A has been transferred to hard mask 1030A. In the embodiment shown, hard mask 1030A has depressions 1030B in the regions where hard mask layer 1030 was etched. Thus, the pattern of DUV mask 1050A has been transferred to hard mask 1030A.

Figure 14:
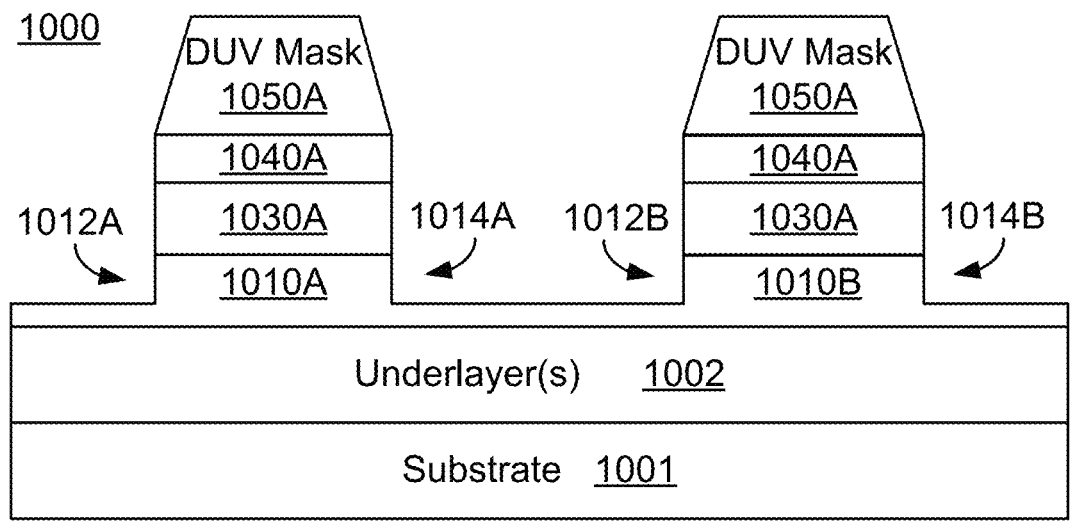

FIG. 14 depicts device 1000 after 924 has been completed. Thus, LN optical devices 1010A and 1010B have been formed. LN device 1010A has sidewalls 1012A and 1014A. LN optical device 1010B has sidewalls 1012B and 1014B.

Figure 15:
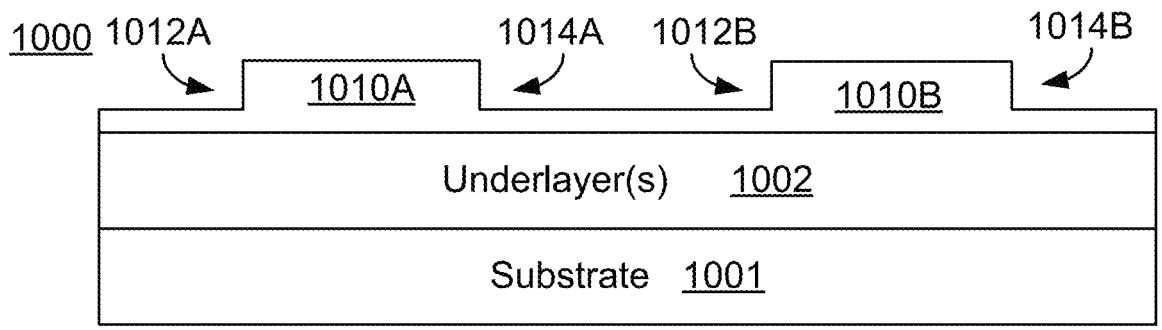

FIG. 15 depicts device 1000 after 926 has been completed and the layers above LN optical devices 1010A and 1010B have been removed. Device 1000 may undergo further processing to complete optical and/or other devices utilizing LN optical devices 1010A and/or 1010B.

LN optical devices 1010A and 1010B are formed using DUV lithography of method 900. Thus, sidewalls 1012A, 1014A, 1012B and 1014B of LN optical devices 1010A and 1010B have improved surface roughness. The short range RMS surface roughnesses of sidewalls 1012A, 1014A, 1012B and 1014B are each less than ten nanometers. In some embodiments, the short range RMS surface roughness for each sidewall 1012A, 1014A, 1012B and 1014B is not more than five nanometers. The short range RMS surface roughness of each sidewall 1012A, 1014A, 1012B and 1014B does not exceed two nanometers in some embodiments.

Optical devices 1010A and 1010B may have improved performance. In some embodiments, each LN optical device 1010A and 1010B has a loss in signal of not more than 5 dB/cm. In some embodiments, LN optical device 1010A and 1010B each has a loss of not more than 2 dB/cm. In some such embodiments, the loss for each of LN optical devices 1010A and 1010B is less than 1.0 dB/cm. For example, this loss may be not more than 0.5 dB/cm in some embodiments.

FIGS. 16-21 depict an embodiment of device 1600 including LN and formed using method 900 during fabrication. FIGS. 16-21 are not to scale and only a portion of the device 1600 is shown. Further, device 1600 is for explanatory purposes and may not represent a particular device. For example, sidewalls are shown as vertical and flat, while top surface are shown as horizontal and flat. However, some variations are generally present.

Figure 16:
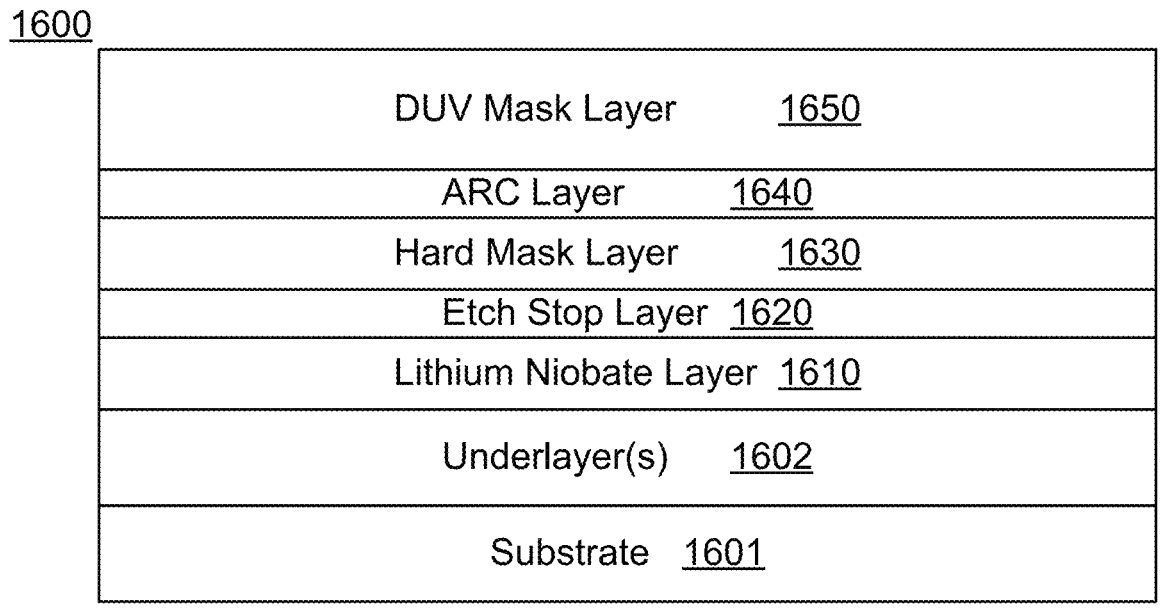
FIGS. 16-21 depict another embodiment of an optical device including lithium niobate formed using ultraviolet photolithography during fabrication.

FIG. 16 depicts device 1600 after 902, 904, 906 and 908 have been completed. Thus, substrate 1601 which may include a carrier wafer, underlayer 1602, LN layer 1610, etch stop layer 1620, hard mask layer 1630, ARC layer 1640 and DUV mask layer 1650 are shown. Underlayer 1602 may be an insulator such as silicon dioxide. In this embodiment, underlayer 1602 is depicted separately from substrate 1601. Etch stop layer 1620 may include amorphous silicon and/or other material insensitive to one or more of the etch(es) used for hard mask layer 1630. Etch stop layer 1620 may be at least ten nanometers thick and not more than fifty nanometers thick in some embodiments. In some embodiments, etch stop layer 1620 may also be removed without undue damage to the underlying LN layer 1610. In some embodiments, other layers may be present and/or some layer(s) shown may be omitted. For example, underlayer(s) 1602 may be omitted in some embodiments.

Figure 17:
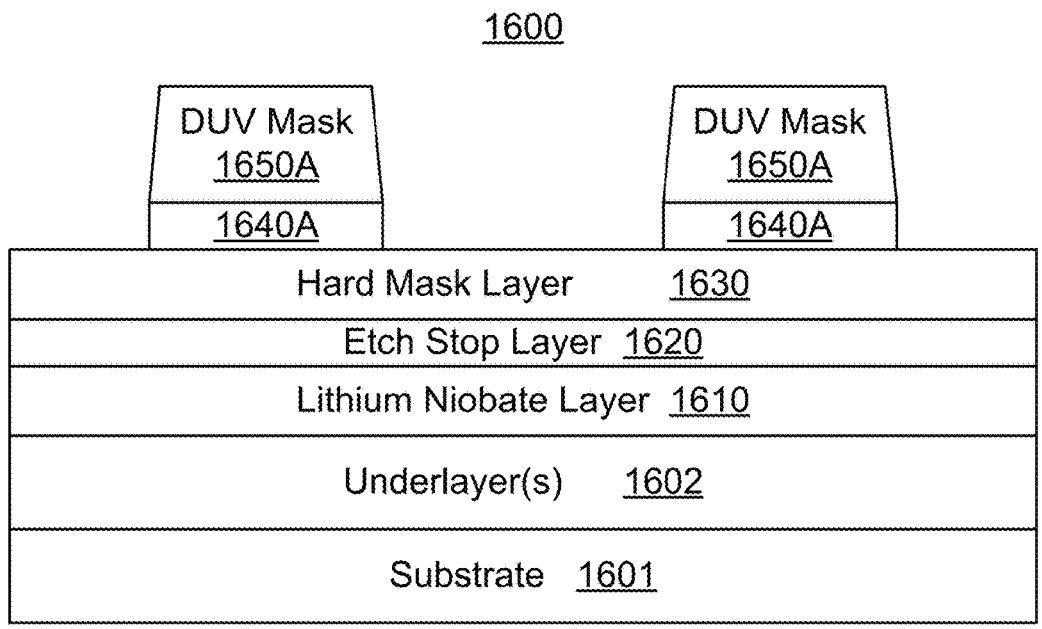

FIG. 17 depicts device 1600 after 910, 912, 914, 916 and 918 have been completed. DUV mask layer 1650 has undergone a pre-exposure bake, been selectively exposed to DUV radiation, undergone a post-exposure bake and developed. Thus, DUV mask 1650A has been formed. Portions of ARC layer 1640 uncovered by DUV mask 1650A have been removed. Thus, ARC layer portions 1640A remain. Portions of hard mask layer 1630 are uncovered.

Figure 18:
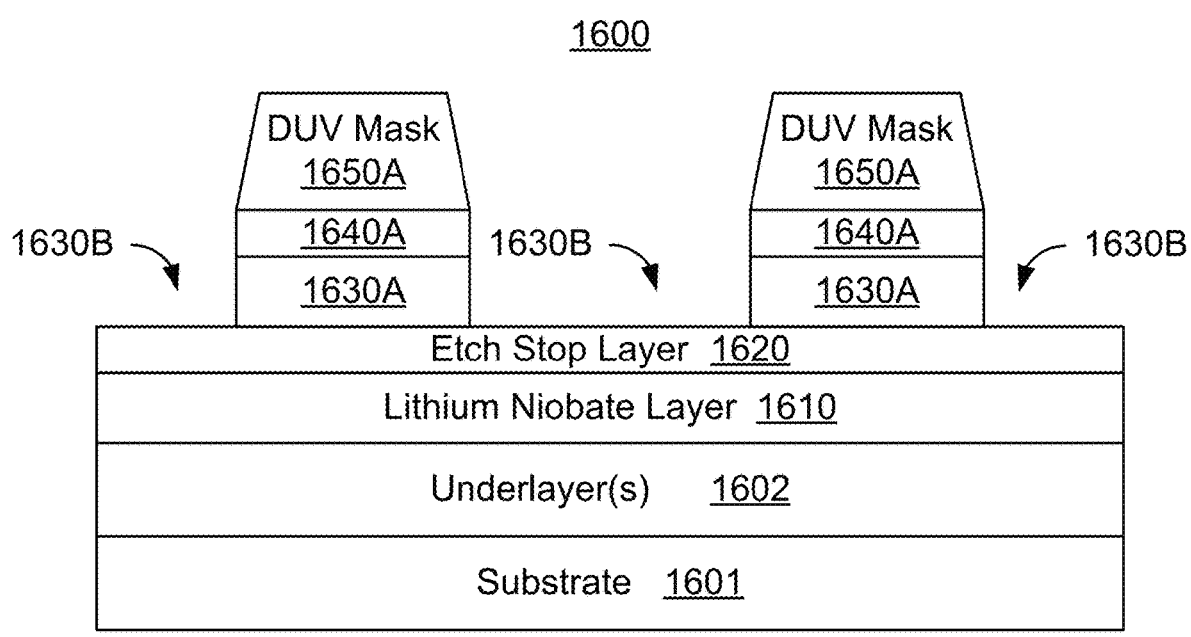

FIG. 18 depicts device 1600 after 920 has been completed. Thus, the pattern of DUV mask 1650A has been transferred to hard mask 1630A. In the embodiment shown, hard mask 1630A has apertures 1630B in the regions where hard mask layer 1630 was etched. Thus, portions of etch stop layer 1620 are uncovered. Thus, the pattern of DUV mask 1650A has been transferred to hard mask 1630A.

Figure 19:
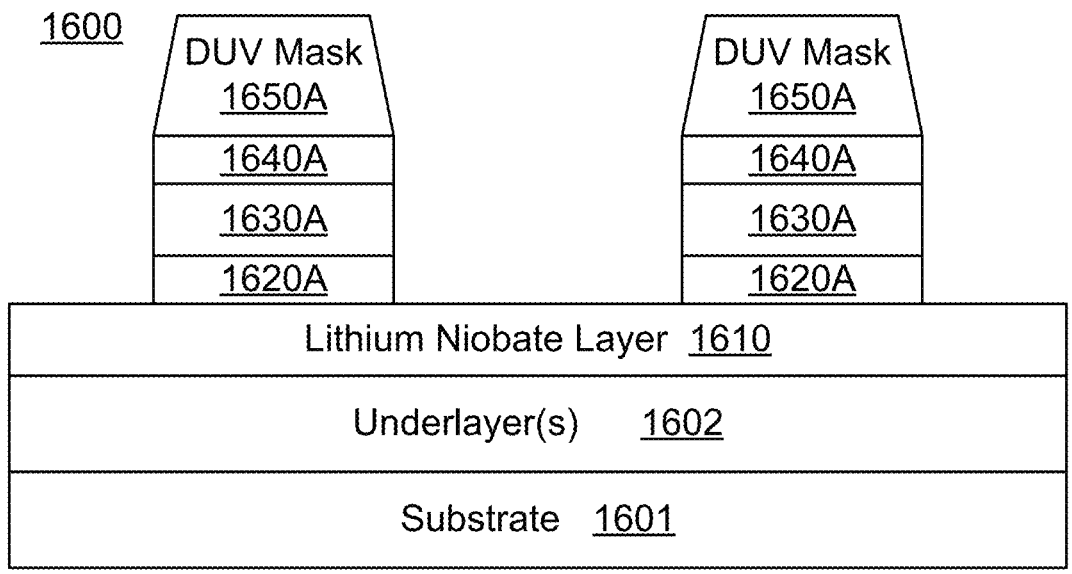

FIG. 19 depicts device 1600 after 922 has been completed or etch stop layer 1620 has been selectively etched as part of transfer of the pattern to LN layer 1610. Thus, the uncovered regions of etch stop layer 1620 have been removed. Portions 1620A of the etch stop layer remain. In some embodiments, etch stop layer 1620 need not be completely removed at 922. In such embodiments, LN layer 1610 may be covered by a portion of the etch stop layer. Such portions are then removed by the pattern transfer at 924.

Figure 20:
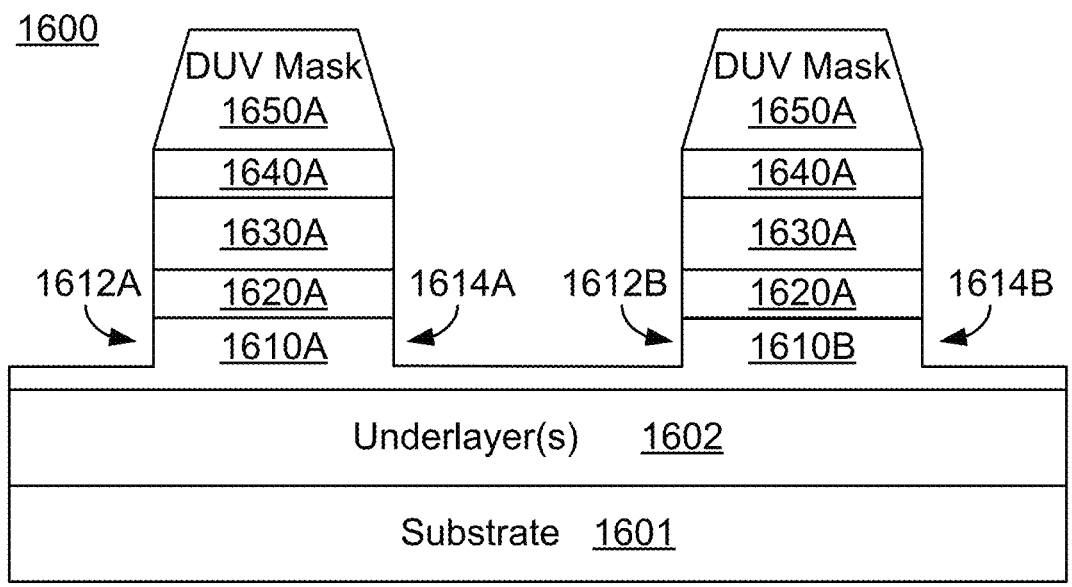

FIG. 20 depicts device 1600 after 924 has been completed. Thus, LN optical devices 1610A and 1610B have been formed. LN device 1610A has sidewalls 1612A and 1614A. LN optical device 1610B has sidewalls 1612B and 1614B.

Figure 21:
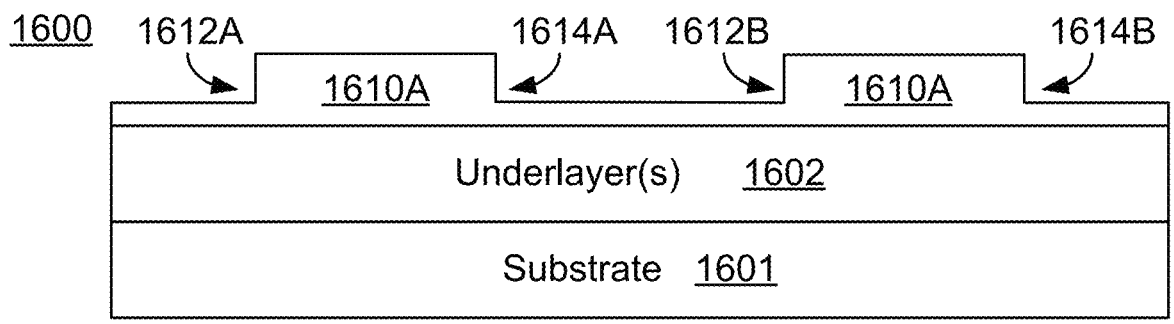

FIG. 21 depicts device 1600 after 926 has been completed and the layers above LN optical devices 1610A and 1610B have been removed. Device 1600 may undergo further processing to complete optical and/or other devices utilizing LN optical devices 1610A and/or 1610B.

LN optical devices 1610A and 1610B are formed using DUV lithography of method 900. Thus, sidewalls 1612A, 1614A, 1612B and 1614B of LN optical devices 1610A and 1610B have improved surface roughness. The short range RN/IS surface roughnesses of sidewalls 1612A, 1614A, 1612B and 1614B are each less than ten nanometers. In some embodiments, the short range RMS surface roughness for each sidewall 1612A, 1614A, 1612B and 1614B is not more than five nanometers. The short range RMS surface roughness of each sidewall 1612A, 1614A, 1612B and 1614B does not exceed two nanometers in some embodiments.

Optical devices 1610A and 1610B may have improved performance. In some embodiments, each LN optical device 1610A and 1610B has a loss in signal of not more than 5 dB/cm. In some embodiments, LN optical device 1610A and 1610B each has a loss of not more than 2 dB/cm. In some such embodiments, the loss for each of LN optical devices 1610A and 1610B is less than 1.0 dB/cm. For example, this loss may be not more than 0.5 dB/cm in some embodiments.

Thus, method 900 provides LN optical devices 1010A, 1010B, 1610A and/or 1610B that may have improved manufacturability, performance and reduced sidewall surface roughness. Because DUV lithography is utilized, throughput may be increased and the time taken to fabricate devices 1000 and 1600 reduced, uniformity may be improved and reproducibility enhanced. Moreover, use of DUV lithography may be more readily scaled to fabrication of large numbers of devices in manufacturing. DUV lithography also has larger stitched regions. For example, in some embodiments, a stitched region that is at least ten millimeters by ten millimeters may undergo DUV lithography in a single shot. In some embodiments, a stitched region may be at least fifteen millimeters by fifteen millimeters. For example, a stitched region may be nominally twenty millimeters by twenty millimeters or larger. Thus, the number of stitches (not shown) is reduced. This may not only increase throughput and reproducibility, but also reduce misalignments in an optical device. Thus, fabrication and performance of optical devices including LN may be enhanced.

As discussed above, the fabrication techniques and devices described herein apply to other nonlinear optical material(s), such as ferroelectric nonlinear optical material(s) including, but not limited to, LT. For example, LT, potassium niobate, gallium arsenide, potassium titanyl phosphate, lead zirconate titanate, and/or barium titanate may be used in lieu of or in addition to LN. Thus, performance and fabrication of optical devices including ferroelectric nonlinear optical material(s) may be improved.

Although the foregoing embodiments have been described in some detail for purposes of clarity of understanding, the invention is not limited to the details provided. There are many alternative ways of implementing the invention. The disclosed embodiments are illustrative and not restrictive.

What is claimed is:

1. A device, comprising:
   an optical device, at least a portion of the optical device including at least one ferroelectric nonlinear optical material, the at least the portion of the optical device being fabricated utilizing ultraviolet (UV) photolithography and including a sidewall;
   wherein the sidewall is fabricated using the UV photolithography, a first etch and a second etch, the UV photolithography being used to form a mask for fabricating a hard mask from a hard mask layer, the first etch for removing a portion of the hard mask layer to form the hard mask, the second etch for removing a portion of the at least one ferroelectric nonlinear optical material to form the sidewall, the second etch being selected from a dry etch, a reactive ion etch (RIE), a plasma etch and a chemical etch, the second etch being different from the first etch such that the sidewall has a short range root mean square roughness of less than ten nanometers.

2. The device of claim 1, wherein the at least one ferroelectric nonlinear optical material includes at least one of lithium tantalate, potassium niobate, gallium arsenide, potassium titanyl phosphate, lead zirconate titanate, and barium titanate.

3. The device of claim 2, wherein the at least one ferroelectric nonlinear optical material consists of lithium tantalate.

4. The device of claim 1, wherein the short range root mean square surface roughness is not more than five nanometers.

5. The device of claim 1, wherein the at least the portion of the optical device has a loss of not more than 2 dB/cm.

6. The device of claim 5, wherein the loss is less than 1.0 dB/cm.

7. The device of claim 6, wherein the loss is less than 0.5 dB/cm.

8. The device of claim 7, wherein the loss is not more than 0.1 dB/cm.

9. A method of providing an optical device, comprising:
   providing a hard mask layer on a ferroelectric nonlinear optical layer, the ferroelectric nonlinear optical layer including at least one ferroelectric nonlinear optical material;
   providing a mask on the hard mask layer, the mask having a pattern formed using ultraviolet (UV) lithography;
   forming a hard mask from the hard mask layer by transferring the pattern to the hard mask layer, the forming including performing a first etch for removing a portion of the hard mask layer to form the hard mask; and
   transferring the pattern from the hard mask to the ferroelectric nonlinear optical layer to form at least a portion of the optical device including a sidewall of the at least one ferroelectric nonlinear optical layer, the transferring the pattern including performing a second etch for removing a portion of the at least one ferroelectric nonlinear optical layer to form the sidewall, the second etch being selected from a dry etch, a reactive ion etch (RIE), a plasma etch and a chemical etch, the second etch being different from the first etch such that the sidewall has a short range root mean square roughness of less than ten nanometers.

10. The method of claim 9, wherein the providing the mask further includes:
   providing a mask layer;
   heat treating the mask layer at a bake temperature of greater than 140 degrees Celsius;
   exposing portions of the mask layer using electromagnetic radiation in a UV wavelength range after the heat treating; and
   developing the mask layer after the exposing to form at least one aperture in the mask layer corresponding to the pattern and form the mask.

11. The method of claim 10, wherein the heat treating further includes:
increasing a temperature for the mask layer at a rate of not more than 140 degrees Celsius per minute.

12. The method of claim 10, wherein the providing the mask further includes:
performing an additional heat treating after the exposing and before the developing, the additional heat treating being at an additional temperature of greater than one hundred forty degrees Celsius.

13. The method of claim 9 wherein the UV providing the mask further includes utilizing deep UV (DUV) lithography.

14. The method of claim 9, wherein the pattern includes a plurality of stitched regions, each of the plurality of stitched regions having an area of at least ten millimeters by ten millimeters.

15. The method of claim 9, wherein the hard mask layer includes at least one of silicon oxide, amorphous silicon and silicon nitride.

16. The method of claim 9, wherein the ferroelectric nonlinear optical layer includes at least one of lithium tantalate, potassium niobate, gallium arsenide, potassium titanyl phosphate, lead zirconate titanate, and barium titanate.

17. A method for providing an optical device, comprising:
providing a hard mask layer on a ferroelectric nonlinear optical layer, the ferroelectric nonlinear optical layer including at least one ferroelectric nonlinear optical material;
providing a mask on the hard mask layer, the mask having a pattern formed using deep ultraviolet (DUV) lithography, the providing the mask further including
providing a mask layer;
heat treating the mask layer at a first temperature of greater than 140 degrees Celsius, the heat treating including increasing a temperature for the mask layer at a rate of not more than 140 degrees Celsius per minute;
exposing portions of the mask layer using electromagnetic radiation in a DUV wavelength range;
performing an additional heat treating after the exposing at a second temperature of greater than one hundred forty degrees Celsius, the additional heat treating including increasing an additional temperature for the mask layer at an additional rate of not more than 140 degrees Celsius per minute;
developing the mask layer after the additional heat treating to form at least one aperture in the mask layer corresponding to the pattern and form the mask;
forming a hard mask from the hard mask layer by transferring the pattern to the hard mask layer using a hard mask etching; and
etching the ferroelectric nonlinear optical layer to transfer the pattern from the hard mask to the ferroelectric nonlinear optical layer and form a sidewall therein, the etching being selected from dry etching, reactive ion etching (RIE), plasma etching and chemical etching, the etching being different from the hard mask etching such that the sidewall has the short range root mean square roughness of less than ten nanometers.

18. The method of claim 17, wherein the ferroelectric nonlinear optical layer includes at least one of lithium tantalate, potassium niobate, gallium arsenide, potassium titanyl phosphate, lead zirconate titanate, and barium titanate.

19. The optical device of claim 1, wherein the optical device is formed from a wafer including a plurality of stitched regions on the at least one ferroelectric nonlinear optical layer material, each of the plurality of stitched regions having an area of at least ten millimeters by ten millimeters.

* * * * *